(12) United States Patent
Takakura et al.

(10) Patent No.: US 12,309,932 B2
(45) Date of Patent: May 20, 2025

(54) ELECTRONIC COMPONENT MODULE, SUB-MODULE, AND METHOD FOR MANUFACTURING SAME

(71) Applicant: Murata Manufacturing Co., Ltd., Kyoto (JP)

(72) Inventors: Tsuyoshi Takakura, Nagaokakyo (JP); Yoshihito Otsubo, Nagaokakyo (JP); Tadashi Nomura, Nagaokakyo (JP); Hideo Nakagoshi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 171 days.

(21) Appl. No.: 18/298,451

(22) Filed: Apr. 11, 2023

(65) Prior Publication Data
US 2023/0309230 A1 Sep. 28, 2023

Related U.S. Application Data

(63) Continuation of application No. PCT/JP2021/037713, filed on Oct. 12, 2021.

(30) Foreign Application Priority Data

Oct. 16, 2020 (JP) ................................ 2020-174835

(51) Int. Cl.
*H05K 1/18* (2006.01)
*H01L 23/552* (2006.01)
(Continued)

(52) U.S. Cl.
CPC ............. *H05K 1/18* (2013.01); *H01L 23/552* (2013.01); *H01L 25/0657* (2013.01);
(Continued)

(58) Field of Classification Search
CPC .......... H05K 1/18; H05K 1/181–1/187; H01L 21/561; H01L 23/498; H01L 23/5383; H01L 23/5385; H01L 23/552
(Continued)

(56) References Cited

U.S. PATENT DOCUMENTS 7,749,807 B2 * 7/2010 Karnezos ............ H01L 23/4334
257/784
9,831,148 B2 * 11/2017 Yu ........................... H01L 24/20
(Continued)

FOREIGN PATENT DOCUMENTS

JP 2008-311267 A 12/2008
JP 4424449 B2 3/2010
(Continued)

OTHER PUBLICATIONS

International Search Report for PCT/JP2021/037713 dated Dec. 28, 2021.

*Primary Examiner* — Tuan T Dinh
(74) *Attorney, Agent, or Firm* — McDonald Hopkins LLC (57) ABSTRACT

The present disclosure is directed to an electronic component module including: a substrate; an electronic component mounted on the substrate; and a sub-module mounted on the substrate, the sub-module including a wiring board, a first electronic component disposed on one of two main surfaces of the wiring board, a second electronic component disposed on the other of the two main surfaces of the wiring board, and a first sealing member that covers the wiring board, the first electronic component, and the second electronic component.

3 Claims, 7 Drawing Sheets (51) Int. Cl.
*H01L 25/00* (2006.01)
*H01L 25/065* (2023.01)
*H01L 25/16* (2023.01)
*H05K 3/32* (2006.01)
*H05K 3/34* (2006.01)
*H05K 9/00* (2006.01)
*H01L 23/00* (2006.01)

(52) U.S. Cl.
CPC ............ *H01L 25/162* (2013.01); *H01L 25/50* (2013.01); *H05K 3/321* (2013.01); *H05K 3/34* (2013.01); *H05K 9/0022* (2013.01); *H01L 24/16* (2013.01); *H01L 2224/16237* (2013.01); *H05K 2201/10015* (2013.01); *H05K 2201/10022* (2013.01); *H05K 2201/1003* (2013.01); *H05K 2201/1006* (2013.01); *H05K 2201/10378* (2013.01); *H05K 2201/10515* (2013.01); *H05K 2201/10522* (2013.01); *H05K 2201/1053* (2013.01)

(58) Field of Classification Search
USPC ....... 361/760, 764, 784, 790, 792–795, 816, 361/818; 257/660–690
See application file for complete search history.

(56) References Cited

U.S. PATENT DOCUMENTS

| | | | |
|---|---|---|---|
| 11,985,804 B2* | 5/2024 | Bhat | H05K 1/023 |
| 2007/0170582 A1 | 7/2007 | Nomura et al. | |
| 2007/0257348 A1* | 11/2007 | Yang | H01L 23/3128 |
| | | | 257/E21.705 |
| 2010/0027225 A1 | 2/2010 | Yuda et al. | |
| 2012/0049344 A1* | 3/2012 | Pagaila | H01L 24/11 |
| | | | 257/737 |
| 2015/0366063 A1* | 12/2015 | Takagi | H01L 23/49811 |
| | | | 29/831 |
| 2017/0077022 A1* | 3/2017 | Scanlan | H01L 24/19 |
| 2019/0206813 A1* | 7/2019 | Kim | H01L 23/12 |
| 2019/0238134 A1* | 8/2019 | Lee | H01L 23/49811 |
| 2020/0083172 A1* | 3/2020 | Hsieh | H01L 23/13 |
| 2020/0161252 A1* | 5/2020 | Yang | H01L 21/561 |
| 2020/0203288 A1 | 6/2020 | Otsubo et al. | |
| 2021/0091017 A1* | 3/2021 | Yeon | H01L 24/16 |
| 2021/0159133 A1 | 5/2021 | Aikawa et al. | |

FOREIGN PATENT DOCUMENTS

| | | |
|---|---|---|
| JP | 2013-058516 A | 3/2013 |
| WO | 2007/072616 A1 | 6/2007 |
| WO | 2019/045088 A1 | 3/2019 |
| WO | 2020/066380 A1 | 4/2020 |

\* cited by examiner

ELECTRONIC COMPONENT MODULE, SUB-MODULE, AND METHOD FOR MANUFACTURING SAME

CROSS-REFERENCE OF RELATED APPLICATIONS

This application is a continuation of International Patent Application No. PCT/JP2021/037713, filed on Oct. 12, 2021, which claims the benefit of Japanese Patent Application No. 2020-174835, filed on Oct. 16, 2020, the contents all of which are incorporated herein by reference.

BACKGROUND OF THE DISCLOSURE

Field of the Disclosure

The present disclosure relates to an electronic component module in which a plurality of electronic components are mounted, a sub-module, and a method for manufacturing the same.

Description of the Related Art

Electronic component modules in which a plurality of electronic components are mounted are used for portable terminals such as mobile phones and smartphones and various communication devices. Such an electronic component module is required to have performance such as 1) miniaturization, 2) electromagnetic shielding properties, and 3) heat dissipation and withstand voltage properties.

Regarding miniaturization, a plurality of electronic components represented by SAW filters are mounted on a substrate. These components occupy a large area of the component mounting surface. This affects the size of the entire module.

With respect to electromagnetic shielding properties, a structure having a metal piece (radio wave shielding wall) disposed around each component is generally used for measures against noise due to the influences of radio wave interference caused when components operating in a plurality of frequency bands are simultaneously operated and a magnetic field from an inductor component. When such an electromagnetic shield is installed, problems such as influence on the size of the entire module, limitation of a wall shielding effect, and complication of a manufacturing process are assumed.

In addition, regarding heat dissipation and withstand voltage properties, in recent years, modules have been required to have higher power, and heat dissipation and withstand voltage properties pose important challenges for electronic components such as integrated circuits (ICs), SAW filters, and bulk acoustic wave (BAW) filters. In order to improve the heat dissipation and withstand voltage properties in a conventional module structure, it is necessary to increase the planar size of each electronic component. For example, in order to ensure the withstand voltage property of an IC (integrated circuit), it is necessary to increase the surface size of the IC. This makes it difficult to densely mount components in the module.

Patent Document 1 below discloses a component-embedded module in which a plurality of electronic components are two-dimensionally mounted and which has a sub-module having an area smaller than that of a module substrate.

Patent Document 1: JP 4424449 B2

BRIEF SUMMARY OF THE DISCLOSURE

A possible benefit of the present disclosure is to provide an electronic component module capable of mounting components in the module at high density.

Another possible benefit of the present disclosure is to provide a method for manufacturing a sub-module mountable in an electronic component module.

An aspect of the present disclosure is an electronic component module including: a substrate; an electronic component mounted on the substrate; and a sub-module mounted on the substrate, the sub-module including a wiring board, a first electronic component disposed on one of two main surfaces of the wiring board, a second electronic component disposed on the other of the two main surfaces of the wiring board, and a first sealing member that covers the wiring board, the first electronic component, and the second electronic component.

A method for manufacturing a sub-module according to another aspect of the present disclosure includes steps of: preparing a first electronic component having a first surface and a second surface facing each other; providing a wiring board on a second surface side of the first electronic component and a wiring conductor on a side surface side of the first electronic component; stacking a second electronic component having a first surface and a second surface facing each other on a second surface side of the first electronic component to electrically connect the wiring board, the wiring conductor, and a terminal of the second electronic component; and covering the first electronic component, the second electronic component, the wiring board, and the wiring conductor with a sealing member.

According to the present disclosure, components in a module can be mounted at high density.

BRIEF DESCRIPTION OF THE SEVERAL VIEWS OF THE DRAWINGS

FIGS. 5A to 5H are diagrams illustrating an example of a configuration of a sub-module 30 according to the fifth embodiment of the present disclosure, in which

DETAILED DESCRIPTION OF THE DISCLOSURE

An aspect of the present disclosure is an electronic component module including: a substrate; an electronic component mounted on the substrate; and a sub-module mounted on the substrate, the sub-module including a wiring board, a first electronic component disposed on one of two main surfaces of the wiring board, a second electronic component disposed on the other of the two main surfaces of the wiring board, and a first sealing member that covers the wiring board, the first electronic component, and the second electronic component.

According to this configuration, by providing the sub-module in which the first electronic component and the second electronic component are stacked on both sides of the wiring board, the component mounting density in the module is increased.

In the present disclosure, a first shield film may be provided on a surface of the first sealing member of the sub-module.

This configuration can suppress electromagnetic wave interference between an electronic component located inside the electronic component module and outside the sub-module and the first electronic component and the second electronic component located inside the sub-module.

In the present disclosure, a ground conductor may be provided between the first electronic component and the second electronic component in the sub-module in a direction parallel to a main surface of the wiring board.

This configuration can suppress electromagnetic wave interference between the first electronic component and the second electronic component located inside the sub-module.

The present disclosure includes a second sealing member that covers the sub-module, the first electronic component, and the second electronic component. A second shield film may be provided on a surface of the second sealing member.

This configuration can suppress electromagnetic wave interference coming from the outside of the electronic component module.

In the present disclosure, one of the first electronic component and the second electronic component may be in direct contact with the second shield film, and the other of the first electronic component and the second electronic component may be in direct contact with a conductor disposed on the substrate.

According to this configuration, the shield film and the conductor can be generally formed of a metal material and hence have good thermal conductivity. Therefore, bringing the electronic component in the sub-module into direct contact with the shield film and the conductor can improve the heat dissipation property.

In the present disclosure, one of the first electronic component and the second electronic component may have a contact surface that is in direct contact with the second shield film and a non-contact surface that is not in direct contact with the second shield film, and the surface roughness of the contact surface may be larger than that of the non-contact surface.

According to this configuration, the contact surface in direct contact with the shield film is roughened by, for example, grinding, and the surface roughness of the contact surface is generally larger than that of the non-contact surface. This makes it possible to enhance the anchor effect and improve the contact strength of the shield film.

A method for manufacturing a sub-module according to still another aspect of the present disclosure includes steps of: preparing a first electronic component having a first surface and a second surface facing each other; providing a wiring board on a second surface side of the first electronic component and a wiring conductor on a side surface side of the first electronic component; stacking a second electronic component having a first surface and a second surface facing each other on a second surface side of the first electronic component to electrically connect the wiring board, the wiring conductor, and a terminal of the second electronic component; and covering the first electronic component, the second electronic component, the wiring board, and the wiring conductor with a sealing member.

According to this configuration, the first electronic component and the second electronic component are stacked to increase the component mounting density.

First Embodiment

Figure 1A:
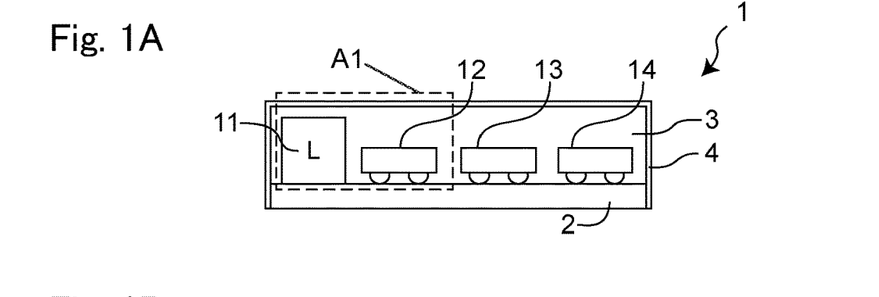
FIG. 1A is a cross-sectional view illustrating an internal configuration of an electronic component module 1 in which a plurality of electronic components are two-dimensionally mounted.

FIG. 1A is a cross-sectional view showing an internal configuration of an electronic component module 1 in which a plurality of electronic components are two-dimensionally mounted. FIGS. 1B to 1E are cross-sectional views illustrating an example of a method for manufacturing an electronic component module according to the first embodiment of the present disclosure.

Referring to FIG. 1A, a plurality of electronic components 11 to 14 are two-dimensionally mounted on a substrate 2. Each of the electronic components 11 to 14 is electrically and mechanically connected to a conductor pattern of the substrate 2 by means of a solder ball, a reflow solder, a conductive adhesive, or the like. As an example, the electronic component 11 is a passive electronic component such as a coil, a capacitor, or a resistor, and the electronic components 12 to 14 are planar electronic component such as a SAW filter and an integrated circuit. The following exemplifies a case where the height of the electronic component 11 is larger than the heights of the electronic component 12 to 14.

Each of the electronic components 11 to 14 is covered by filling with the sealing resin 3, and the outer shape of the electronic component module 1 is determined by the shape of the sealing resin 3. On the outer surface of the sealing resin 3, that is, the top surface and the four side surfaces, the conductor film 4 is provided as a shield film for shielding against electromagnetic waves by, for example, sputtering using a metal material. The conductor film 4 is connected to a ground line of the substrate 2. An area A1 (dashed line) indicates an area including components and the like to be protected from electromagnetic wave interference.

Figure 1B:
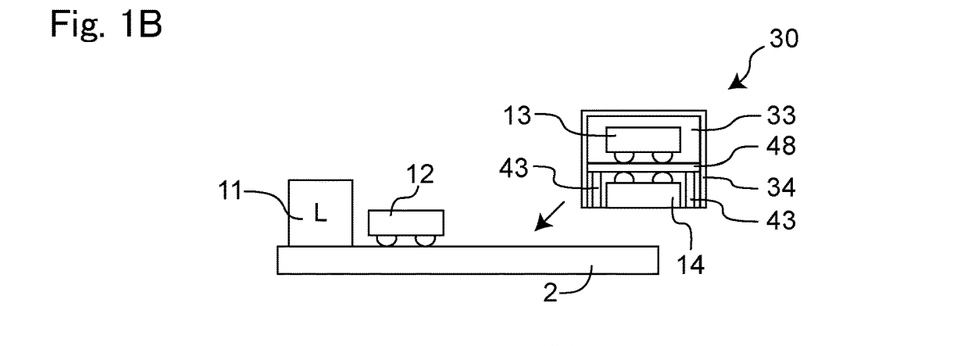
FIGS. 1B to 1E are cross-sectional views illustrating an example of a method for manufacturing an electronic component module according to the first embodiment of the present disclosure.

Referring to FIG. 1B, the electronic components 13 and 14 are configured as a sub-module 30. The electronic components 13 and 14 each have a first surface (for example, in FIG. 1, the lower surface) and a second surface (for example, in FIG. 1, the upper surface) facing each other. The electronic component 13 is stacked on the second surface side of the electronic component 14 in a direction perpendicular to the substrate surface.

Between the electronic component 14 and the electronic component 13, a rewiring layer 48 is provided as a wiring board between the components. The rewiring layer 48 includes a conductor layer/insulating layer. The conductor layer includes a connection electrode and a conductor line that electrically connect the electronic component 14, the electronic component 13, and a wiring conductor 43. The insulating layer may include an interlayer via that connects the conductor layers. For example, the rewiring layer 48 may be a substrate obtained by stacking a plurality of conductor layers/insulating layers on each other. The columnar wiring conductor 43 is provided on the side surface side of the electronic component 14. A connection electrode (not illustrated) connected to the conductor line of the substrate 2 is provided on the first surface side of the electronic component 14. The connection electrode is electrically connected to a terminal of the electronic component 13, for example, a power supply terminal, a ground terminal, or a signal terminal via the wiring conductor 43, the rewiring layer 48, and the like.

The electronic components 13 and 14, the rewiring layer 48, the wiring conductor 43, and the like are covered by filling with the sealing resin 33, and the outer shape of the sub-module 30 is determined by the shape of the sealing resin 33. On the outer surface of the sealing resin 33, that is, the top surface and the four side surfaces, the conductor film 34 is provided as a shield film for shielding against electromagnetic waves by, for example, sputtering using a metal material.

Figure 1C:
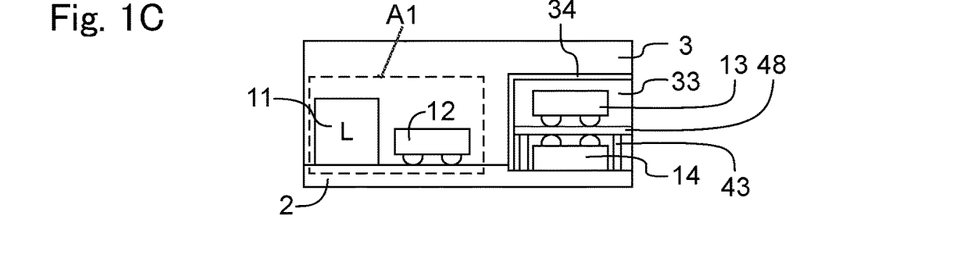

Referring to FIG. 1C, the above-described sub-module 30 is mounted on the substrate 2 on which the electronic components 11 and 12 are mounted in advance. At that time, the electronic component 14 located on the lower side is electrically connected to the conductor line of the substrate 2, and the electronic component 13 located on the upper side can also be electrically connected to the conductor line of the substrate 2 via the rewiring layer 48, the wiring conductor 43, and the like. The conductor film 34 of the sub-module 30 is also connected to the ground line of the substrate 2. Subsequently, the electronic components 11 and 12 and the sub-module 30 are covered by filling with the sealing resin 3. The substrate 2 includes a multilayer substrate, for example, a multilayer ceramic substrate such as LTCC, a multilayer resin substrate, or the like. In the present embodiment, a recess is formed in the substrate 2, whereby the height of an electronic component can be reduced. Alternatively, the substrate 2 may be flat.

Figure 1D:
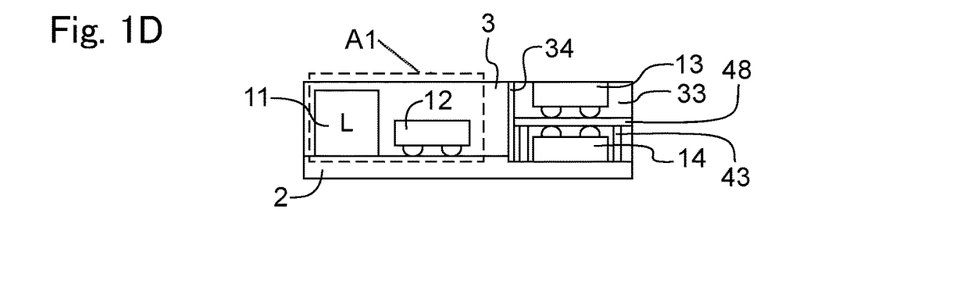

Referring to FIG. 1D, the upper portion of the sealing resin 3 is removed by, for example, grinding, and the conductor film 34 provided on the top surface of the sub-module 30 is also removed. The conductor film 34 provided on the side surface of the sub-module 30 remains as it is, and only the upper edge is exposed. As a result, the outer shape of the electronic component module 1 is determined by the shape of the sealing resin 3.

Figure 1E:
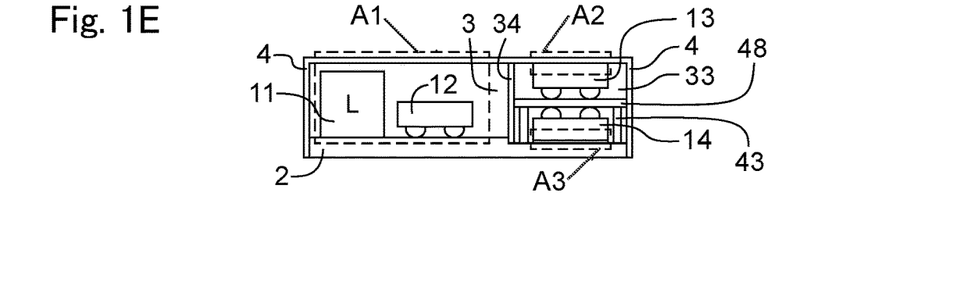

Referring to FIG. 1E, on the outer surface of the sealing resin 3, that is, the top surface and the four side surfaces, the conductor film 4 is provided as a shield film for shielding against electromagnetic waves by, for example, sputtering using a metal material. The conductor film 4 is electrically connected to the remaining conductor film 34 and is connected to the ground line of the substrate 2. Due to the presence of the conductor film 4, electromagnetic wave interference coming from the outside of the electronic component module 1 can be suppressed.

By adopting the sub-module 30 in which the electronic components 13 and 14 are stacked in this way, the component mounting density in the electronic component module 1 is increased as compared with the configuration of FIG. 1A, and the installation area is reduced. In addition, the conductor film 34 functioning as a shield film can be provided between the electronic components 11 and 12 and the electronic components 13 and 14, and electromagnetic wave interference between them can be suppressed.

In an area A2 (dashed line), the electronic component 13 is in direct contact with the conductor film 4. As a result, part of the heat released from the electronic component 13 is directly transferred to the conductor film 4, and the heat dissipation is improved. In particular, since the contact surface that is in direct contact with the conductor film 4 is roughened by, for example, grinding processing, the surface roughness of the contact surface is generally larger than that of a non-contact surface that is not in direct contact with the conductor film 4, for example, the side surface of a component. This makes it possible to enhance the anchor effect and improve the contact strength of the conductor film. Regarding a method for measuring surface roughness, for example, it is possible to measure the irregularity shape of a surface by scanning the surface with a laser, for example, VK-X 120 (available from KEYENCE CORPORATION) can be used for a laser method, and VR-3000 (available from KEYENCE CORPORATION) can be used for an optical method using no laser.

Also in an area A3 (dashed line), the electronic component 14 is in direct contact with the conductor line of the substrate 2. As a result, part of the heat released from the electronic component 14 is directly transferred to the substrate 2, and the heat dissipation is improved.

Second Embodiment

Figure 2A:
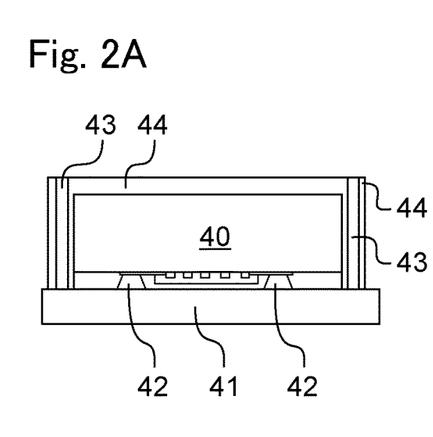
FIGS. 2A to 2C are cross-sectional views illustrating an example of a configuration of a sub-module 30 according to the second embodiment of the present disclosure.
Figure 2B:
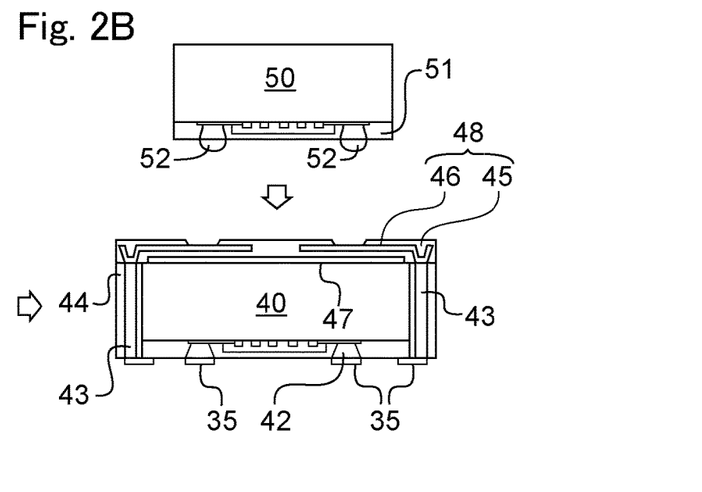
Figure 2C:
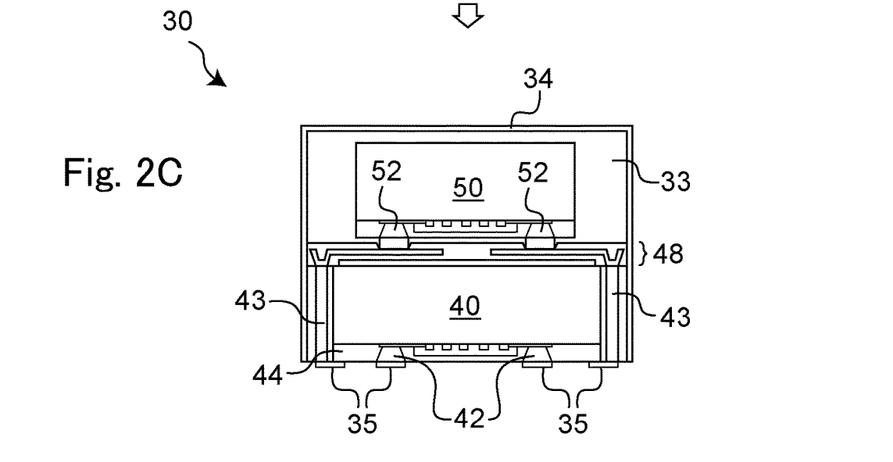
Figure 2D:
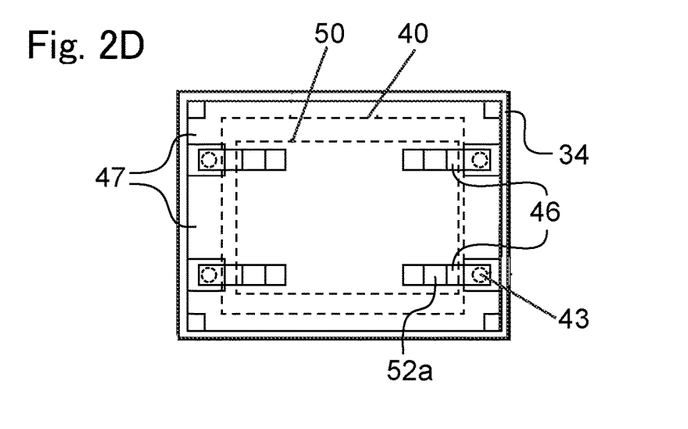
FIG. 2D is a plan view illustrating a ground layer of a rewiring layer.

FIGS. 2A to 2C are cross-sectional views illustrating an example of a configuration of a sub-module 30 according to the second embodiment of the present disclosure. FIG. 2D is a plan view illustrating a ground layer of a rewiring layer.

Referring to FIG. 2A, an electronic component 40 is mounted on a carrier substrate 41 in advance. A terminal 42 is provided on the first surface of the electronic component 40. A columnar wiring conductor 43 is provided on the side surface side of the electronic component 40. The electronic component 40 and the wiring conductor 43 are covered by filling with a sealing resin 44.

Referring to FIG. 2B, the upper portion of the sealing resin 44 is removed by, for example, grinding processing, and the second surface of the electronic component 40 is exposed. Subsequently, a rewiring layer 48 for an electronic component 50 positioned on the upper side is formed on the second surface of the electronic component 40. The rewiring layer 48 includes an electrical insulating layer 45, a conductor layer 46, and a ground layer 47. The conductor layer 46 is electrically connected to the wiring conductor 43. The ground layer 47 is provided in a direction parallel to the main surface of the rewiring layer 48.

As illustrated in FIG. 2D, the ground layer 47 is provided over substantially the entire second surface so as not to be short-circuited to the wiring conductor 43. Further, an outer edge of the ground layer 47 is exposed and can be electrically conducted to the conductor film 34 described later. The corner portion of the ground layer 47 is partially missing in order to prevent burrs at the time of dicing.

Referring back to FIG. 2B, the electronic component 50 including a connection terminal 52 and a sealing resin 51 on the first surface is prepared. The electronic component 50 is mounted on the rewiring layer 48 formed on the second surface of the electronic component 40 to perform electrical connection and mechanical connection. Subsequently, the carrier substrate 41 is removed, and the connection electrode 35 is provided at each of the lower ends of the terminal 42 and the wiring conductor 43.

Referring to FIG. 2C, the periphery of the electronic component 50 is filled with a sealing resin 33, and the entire sub-module is molded into, for example, a rectangular parallelepiped shape. Subsequently, on the outer surfaces of the sealing resin 33 and the sealing resin 44, that is, the top surface and the four side surfaces, the conductor film 34 is provided as a shield film for shielding against electromagnetic waves by, for example, sputtering using a metal material. The conductor film 34 is electrically connected to the ground layer 47 of the rewiring layer 48. Thus, the sub-module 30 having the electronic components 50 stacked on the electronic components 40 is obtained. This makes it possible to reduce the installation area.

The sub-module 30 is mounted on the substrate 2 as illustrated in FIGS. 1A to 1E. At this time, the conductor film 34 is also connected to the ground line of substrate 2. Due to the presence of the conductor film 34, electromagnetic wave interference coming from the outside of the sub-module 30 can be suppressed.

Third Embodiment

Figure 3A:
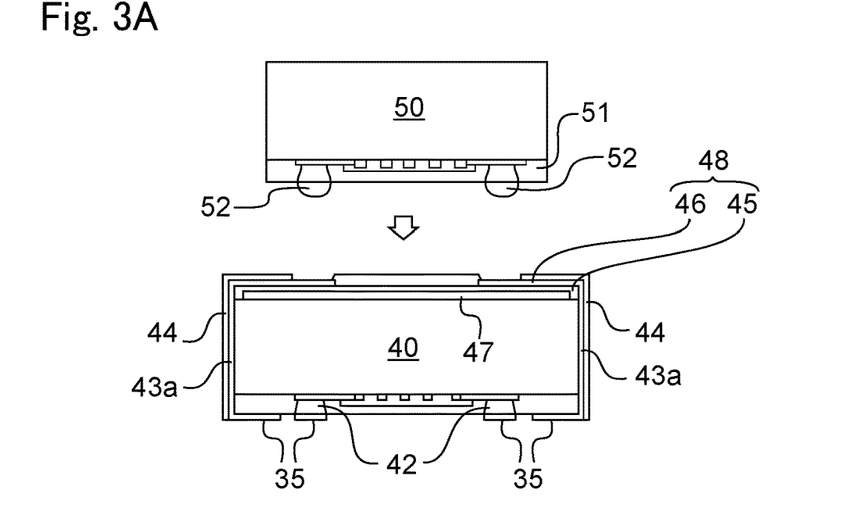
FIGS. 3A and 3B are cross-sectional views illustrating an example of a configuration of a sub-module 30 according to the third embodiment of the present disclosure.
Figure 3B:
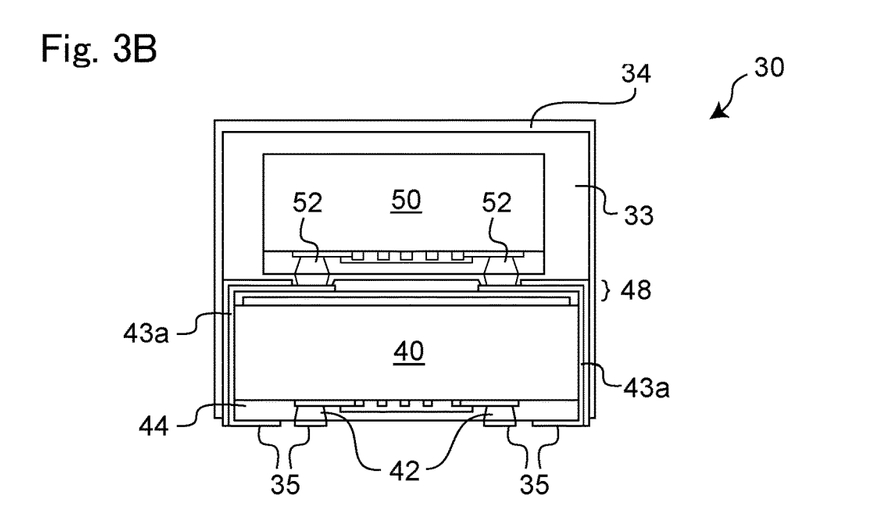
Figure 3C:
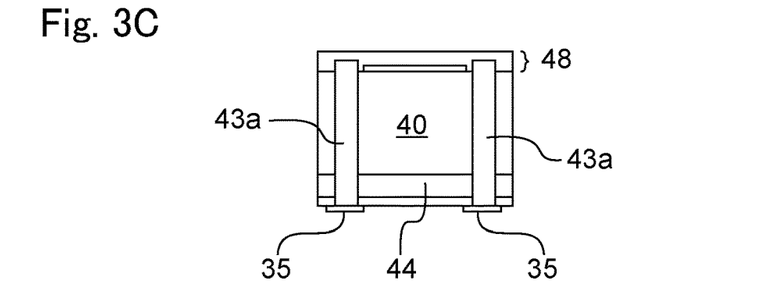
FIG. 3C is a side view illustrating side surface wiring.

FIGS. 3A to 3B are cross-sectional views illustrating an example of a configuration of a sub-module 30 according to the third embodiment of the present disclosure, and FIG. 3C is a side view illustrating side surface wiring. The basic configuration according to the present embodiment is similar to that of the second embodiment, but is different in that side surface wiring 43a is provided on a side surface of the electronic component 40 instead of the columnar wiring conductor 43.

Referring to FIG. 3A, a rewiring layer 48 including an electrical insulating layer 45, a conductor layer 46, and a ground layer 47 is formed on the second surface of the electronic component 40 as in the second embodiment. As shown in FIG. 3C, the conductor layer 46 is electrically connected to the side surface wiring 43a provided on the side surface of the electronic component 40. The peripheries of the electronic component 40 and the side surface wiring 43a are filled with a sealing resin 44.

Next, an electronic component 50 including a connection terminal 52 and a sealing resin 51 on the first surface is mounted on the rewiring layer 48 to perform electrical connection and mechanical connection. Subsequently, a connection electrode 35 is provided at each of the lower ends of the terminal 42 and the side surface wiring 43a.

Referring to FIG. 3B, the periphery of the electronic component 50 is filled with a sealing resin 33, and the entire sub-module is molded into, for example, a rectangular parallelepiped shape. Subsequently, on the outer surfaces of the sealing resin 33 and the sealing resin 44, that is, the top surface and the four side surfaces, the conductor film 34 is provided as a shield film for shielding against electromagnetic waves by, for example, sputtering using a metal material. The conductor film 34 is electrically connected to the ground layer 47 of the rewiring layer 48. Thus, the sub-module 30 having the electronic components 50 stacked on the electronic components 40 is obtained. This makes it possible to reduce the installation area.

The sub-module 30 is mounted on the substrate 2 as illustrated in FIG. 1. At this time, the conductor film 34 is also connected to the ground line of substrate 2. Due to the presence of the conductor film 34, electromagnetic wave interference coming from the outside of the sub-module 30 can be suppressed.

Fourth Embodiment

Figure 4A:
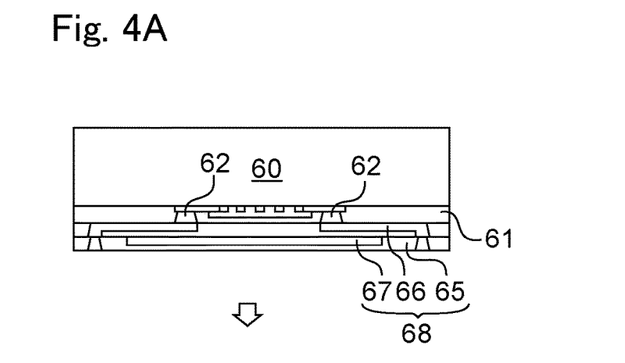
FIGS. 4A to 4C are cross-sectional views illustrating an example of a configuration of a sub-module 30 according to the fourth embodiment of the present disclosure.
Figure 4B:
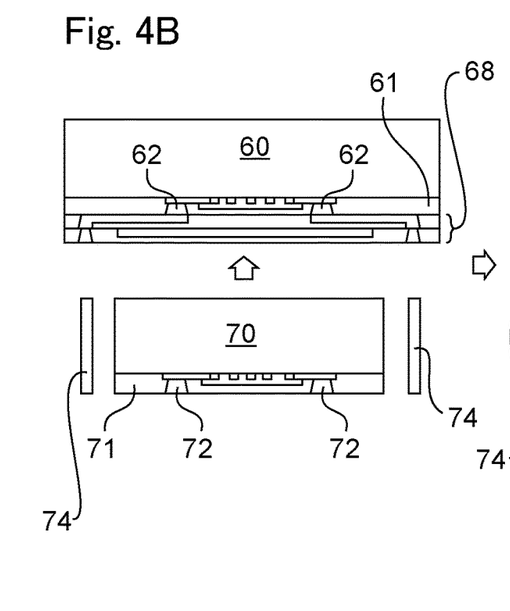
Figure 4C:
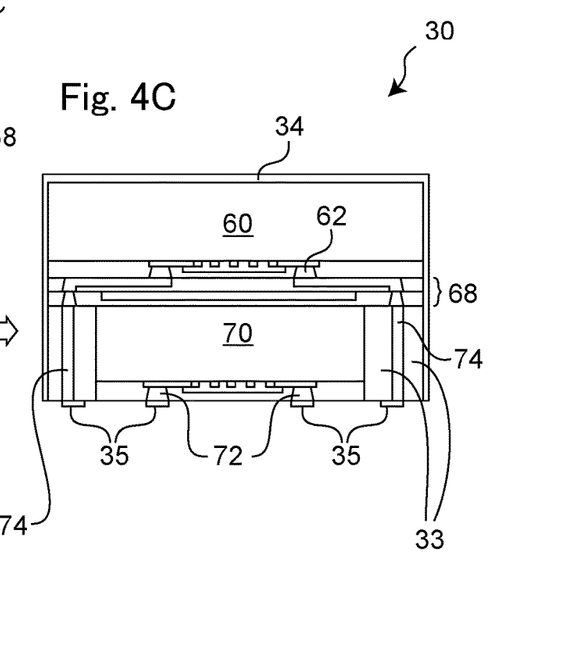

FIGS. 4A to 4C are cross-sectional views illustrating an example of a configuration of a sub-module 30 according to the fourth embodiment of the present disclosure. The basic configuration according to the present embodiment is similar to that of the second embodiment but is different in that a rewiring layer 68 is provided on the first surface of an electronic component 60 located on the upper side.

Referring to FIG. 4A, the electronic component 60 including a connection terminal 62 and a sealing resin 61 on the first surface is prepared. Subsequently, a rewiring layer 68 for an electronic component 70 positioned on the lower side is formed on the first surface of the electronic component 60. The rewiring layer 68 includes an electrical insulating layer 65, a conductor layer 66, and a ground layer 67. Similar to FIG. 2D, the ground layer 67 is provided over substantially the entire first surface so as not to be short-circuited to a wiring conductor 74 (to be described later). Further, an outer edge of the ground layer 67 is exposed and can be electrically conducted to a conductor film 34 described later.

Referring to FIG. 4B, the electronic component 70 including a connection terminal 72 and a sealing resin 71 on the first surface is prepared. Subsequently, the electronic component 70 is joined to the rewiring layer 68 to perform electrical connection and mechanical connection. Furthermore, the columnar wiring conductor 74 is prepared and electrically connected to the conductor layer 66 of the rewiring layer 68.

Referring to FIG. 4C, the periphery of the electronic component 70 is filled with a sealing resin 33, and the entire sub-module is molded into, for example, a rectangular parallelepiped shape. Subsequently, on the outer surfaces of the sealing resin 33 and the sealing resin 61, that is, the top surface and the four side surfaces, the conductor film 34 is provided as a shield film for shielding against electromagnetic waves by, for example, sputtering using a metal material. The conductor film 34 is electrically connected to the ground layer 67 of the rewiring layer 68. Subsequently, the connection electrode 35 is provided at each of the lower ends of the terminal 72 and the wiring conductor 74. Thus, the sub-module 30 having the electronic components 60 stacked on the electronic components 70 is obtained. This makes it possible to reduce the installation area.

The sub-module 30 is mounted on the substrate 2 as illustrated in FIGS. 1A to 1E. At this time, the conductor film 34 is also connected to the ground line of substrate 2. Due to the presence of the conductor film 34, electromagnetic wave interference coming from the outside of the sub-module 30 can be suppressed.

Fifth Embodiment

Figures 5A, 5B, 5C, 5D, 5E, 5F:
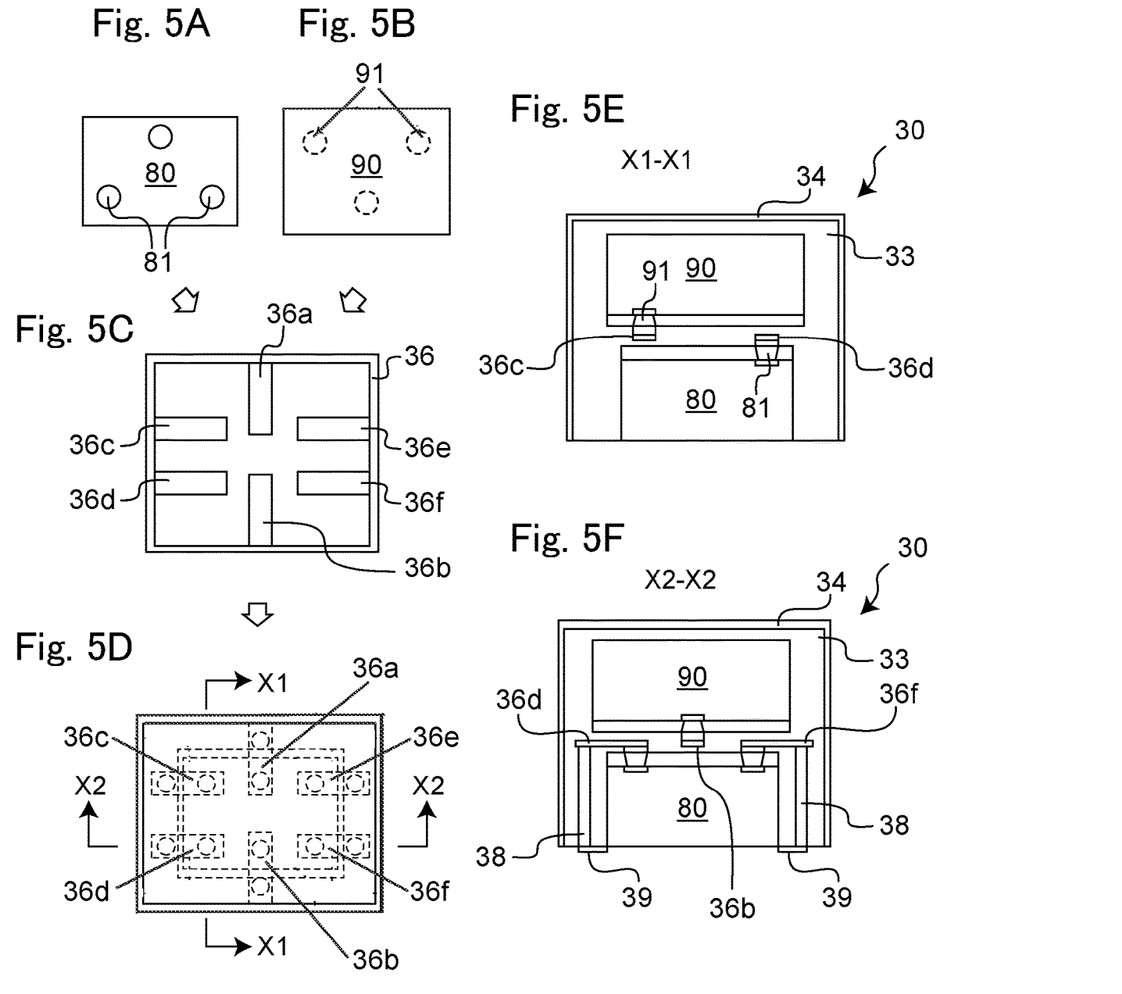
FIGS. 5A and 5B are bump placement diagrams of electronic components 80 and 90.
FIG. 5C is a plan view of a conductor frame 36.
FIG. 5D is a placement diagram of bumps and the conductor frame 36.
FIG. 5E is a cross-sectional view taken along line X1-X1.
FIG. 5F is a cross-sectional view taken along line X2-X2.
Figure 5G:
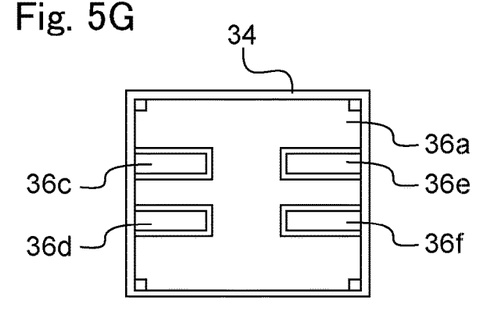
FIG. 5G is a plan view illustrating a modification in which a wide ground plane is provided for the conductor frame 36.
Figure 5H:
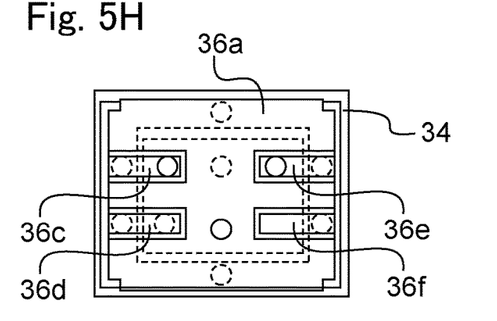
FIG. 5H is a placement diagram of bumps and the conductor frame 36.

FIGS. 5A to 5H are diagrams illustrating an example of a configuration of a sub-module 30 according to the fifth embodiment of the present disclosure, in which FIGS. 5A and 5B are bump placement diagrams of electronic components 80 and 90, FIG. 5C is a plan view of a conductor frame 36, FIG. 5D is a placement diagram of bumps and the conductor frame 36, FIG. 5E is a cross-sectional view taken along line X1-X1, FIG. 5F is a cross-sectional view taken along line X2-X2, FIG. 5G is a plan view illustrating a modification in which a wide ground plane is provided for the conductor frame 36, and FIG. 5H is a placement diagram of bumps and the conductor frame 36. The basic configuration according to the present embodiment is similar to that of the second embodiment but is different in that the conductor frame 36 for wiring is used instead of a rewiring layer 48.

As shown in FIG. 5A, the electronic component 80 having a connection bump 81 on the second surface is prepared. In addition, as shown in FIG. 5B, the electronic component 90 having a connection bump 91 on the first surface is prepared. As an example, three connection bumps 81 are arranged in an equilateral triangle shape, and three connection bumps 91 are arranged in an inverted equilateral triangle shape. Note that the number and placement of the connection bumps are not limited thereto.

Then, As illustrated in FIG. 5C, a conductor frame 36 having six conductors 36a to 36f corresponding to the placement of the connection bumps 81 and 91 is prepared.

As shown in FIGS. 5D to 5F, the electronic components 80 and 90 are stacked in the vertical direction. At that time, the conductor frame 36 is interposed between the electronic components 80 and 90. Subsequently, six columnar wiring conductors 38 are arranged on the side surface side of the electronic component 80, and electrical connection and mechanical connection are performed between the connection bumps 81 and 91, the conductors 36a to 36f, and the wiring conductor 38. That is, the conductors 36a, 36d, and 36f electrically connect the three connection bumps 81 and the three wiring conductors 38, respectively, and the conductors 36b, 36c, and 36e electrically connect the three connection bumps 91 and the three wiring conductors 38, respectively. Thereafter, the outer peripheral frame other than the conductors 36a to 36f is removed by cutting.

The peripheries of the electronic components 80 and 90 are filled with a sealing resin 33, and the entire sub-module is molded into, for example, a rectangular parallelepiped shape. Subsequently, on the outer surface of the sealing resin 33, that is, the top surface and the four side surfaces, the conductor film 34 is provided as a shield film for shielding against electromagnetic waves by, for example, sputtering using a metal material. As illustrated in FIGS. 5G and 5H, in a case where a ground plane having the conductors 36a and 36b combined so as to be widened is provided, the conductor 36a is electrically conducted to the conductor film 34. Subsequently, the connection electrode 39 is provided at each of the lower ends of the wiring conductors 38. Thus, the sub-module 30 having the electronic components 90 stacked on the electronic components 80 is obtained. This makes it possible to reduce the installation area.

The sub-module 30 is mounted on the substrate 2 as illustrated in FIGS. 1A to 1E. At this time, the conductor film 34 is also connected to the ground line of substrate 2. Due to the presence of the conductor film 34, electromagnetic wave interference coming from the outside of the sub-module 30 can be suppressed.

Sixth Embodiment

Figure 6A:
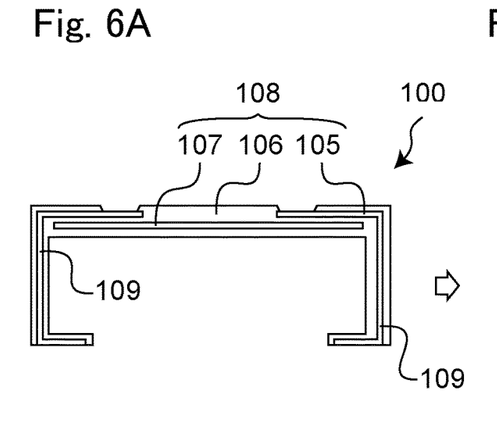
FIGS. 6A, 6C, and 6D are cross-sectional views illustrating an example of a configuration of a sub-module 30 according to the sixth embodiment of the present disclosure.
Figure 6B:
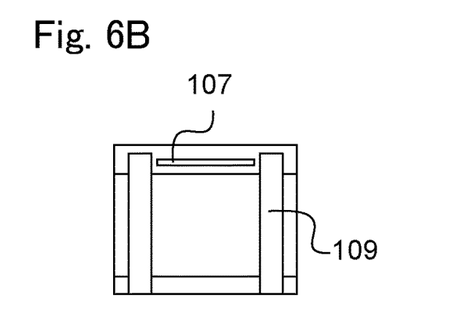
FIG. 6B is a side view illustrating lead wiring.
Figure 6C:
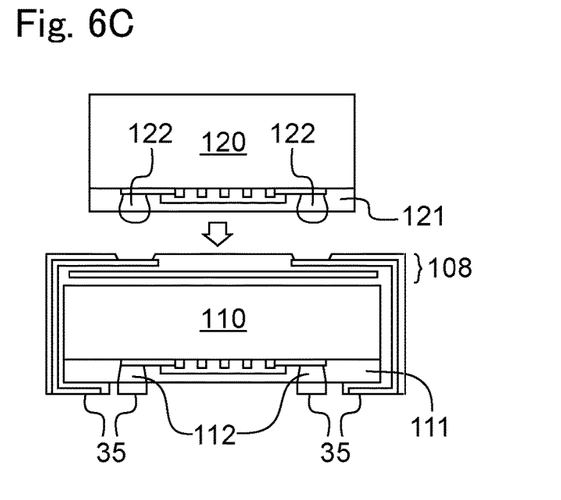
Figure 6D:
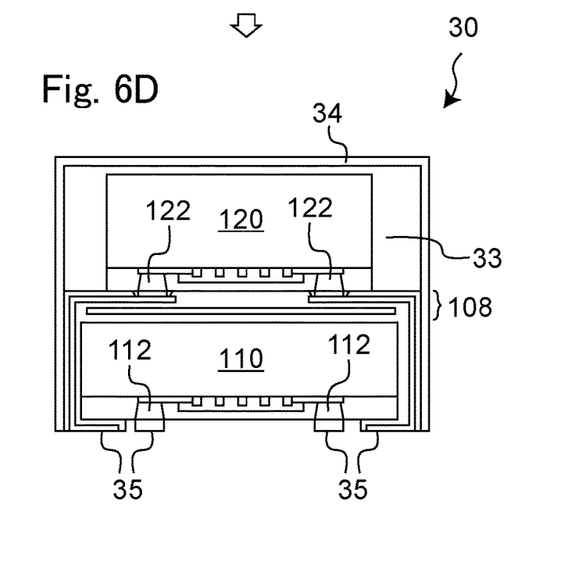

FIGS. 6A, 6C, and 6D are cross-sectional views illustrating an example of a configuration of a sub-module 30 according to the sixth embodiment of the present disclosure, and FIG. 6B is a side view illustrating lead wiring. The basic configuration according to the present embodiment is similar to that of the second embodiment but is different in that a flexible printed circuit (FPC) 100 is used instead of the wiring conductor 43 and the rewiring layer 48.

Referring to FIG. 6A, the FPC 100 including a multilayer wiring layer 108 having an electrical insulating layer 105, a conductor layer 106, and a ground layer 107 and a lead wiring 109 is prepared and bent according to the shape of the electronic component 110 located on the lower side. The lead wiring 109 extends along the side surface of the electronic component 110 and is exposed to the outside on the first surface of the electronic component 110.

Referring to FIG. 6B, for example, the FPC 100 is mounted along the shape of the electronic component 110 using an adhesive. The electronic component 120 including connection terminal 122 and a sealing resin 121 on the first surface is prepared. The electronic component 120 is mounted on the multilayer wiring layer 108 to perform electrical connection and mechanical connection. Subsequently, the connection electrodes 35 are respectively provided at terminals 112 of the electronic component 110 and the lower ends of the lead wiring 109.

Next, Referring to FIG. 6D, the periphery of the electronic component 120 is filled with a sealing resin 33, and the entire sub-module is molded into, for example, a rectangular parallelepiped shape. Subsequently, on the outer surfaces of the sealing resin 33, the electronic component 110, and the FPC 100, that is, the top surface and the four side surfaces, a conductor film 34 is provided as a shield film for shielding against electromagnetic waves by, for example, sputtering using a metal material. The conductor film 34 is electrically conducted to the ground layer 107 of the multilayer wiring layer 108. Thus, the sub-module 30 having the electronic components 120 stacked on the electronic components 110 is obtained. This makes it possible to reduce the installation area.

The sub-module 30 is mounted on the substrate 2 as illustrated in FIGS. 1A to 1E. At this time, the conductor film 34 is also connected to the ground line of substrate 2. Due to the presence of the conductor film 34, electromagnetic wave interference coming from the outside of the sub-module 30 can be suppressed.

Seventh Embodiment

Figure 7:
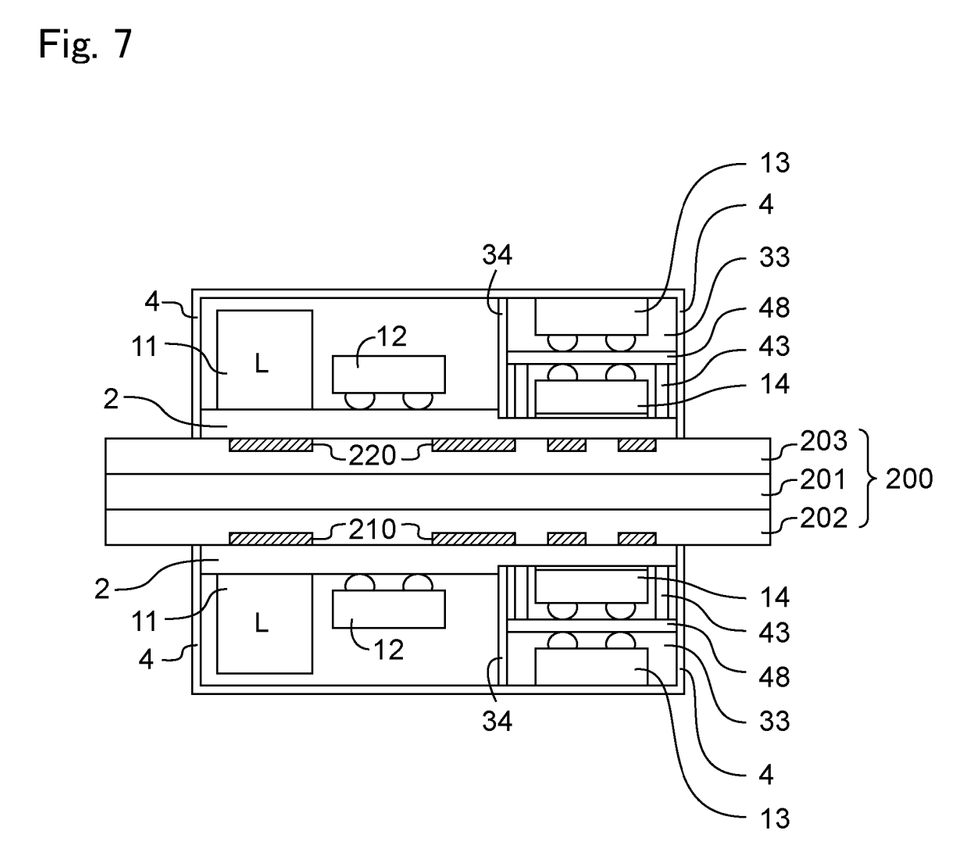
FIG. 7 is a cross-sectional view illustrating an example of an internal configuration of an electronic component module according to the seventh embodiment of the present disclosure.

FIG. 7 is a cross-sectional view illustrating an example of an internal configuration of an electronic component module according to the seventh embodiment of the present disclosure. The basic configuration according to the present embodiment is similar to that of the first embodiment but is different in that a plurality of electronic components are two-dimensionally mounted on both surfaces of a substrate 200, and so-called double-sided mounting is performed.

The substrate 200 is formed from, for example, a multilayer printed board, and wiring layers 202 and 203 on which conductor lines 210 and 220 are formed are provided on both surfaces of an electrical insulating layer 201.

A sub-module 30 including electronic components 11 and 12 and electronic components 13 and 14 is electrically and mechanically joined to the lower wiring layer 202. A sub-module 30 including electronic components 11 and 12 and electronic components 13 and 14 is electrically and mechanically joined to the upper wiring layer 203. A conductor film 4 and a conductor film 34 are connected to a ground line of the substrate 202. Due to the presence of the conductor film 4, electromagnetic wave interference coming from the outside of the electronic component module 1 can be suppressed. In addition, the presence of the conductor film 34 can suppress electromagnetic wave interference between the electronic components 11 and 12 and the electronic components 13 and 14.

Each of the above embodiments has exemplified the case where two electronic components are stacked in the vertical direction inside the sub-module, but it is also possible to stack three or more electronic components in the vertical direction using a similar method. In addition, it is also possible to two-dimensionally arrange two or more electronic components on a large electronic component using a similar method.

Although the present disclosure has been fully described in connection with the preferred embodiments with reference to the accompanying drawings, various changes and modifications will be apparent to those skilled in the art. Such variations and modifications should be understood to be included within the scope of the present disclosure according to the appended claims as long as they do not depart therefrom.

The present disclosure is industrially very useful in that components in a module can be mounted at high density.

1 electronic component module
2 substrate
3, 33, 44 sealing resin
4, 34 conductor film
11 to 14, 40, 50, 60, 70, 80, 90, 110, 120 electronic component
30 sub-module
35 connection electrode
36 conductor frame
36a to 36f conductor
38, 43, 74 wiring conductor
43a side surface wiring
45, 65, 105 electrical insulating layer
46, 66, 106 conductor layer
47, 67, 107 ground layer
48, 68 rewiring layer
81, 91 connection bump
100 flexible printed circuit (FPC)
108 multilayer wiring layer
109 lead wiring

The invention claimed is:

1. An electronic component module comprising:
a substrate;
an electronic component mounted on the substrate;
a sub-module mounted on the substrate, the sub-module including a wiring board having two main surfaces, a first electronic component disposed on one of the two main surfaces of the wiring board, a second electronic component disposed on another one of the two main surfaces of the wiring board, and a first sealing member covering the wiring board, the first electronic component, and the second electronic component; and
a second sealing member covering both the sub-module and another electronic component different from both of the first electronic component and the second electronic component,
wherein a first shield film is provided on a surface of the first sealing member of the sub-module,
wherein a second shield film is provided on a surface of the second sealing member,
wherein one of the first electronic component and the second electronic component is in direct contact with the second shield film,
wherein the first shield film is interposed between the electronic component and the first and second electronic components, and
wherein a top surface of the second sealing member, an upper edge of the first shield film, a top surface of the first sealing member, and a top surface of the first electronic component are positioned on the same plane.

2. The electronic component module according to claim 1, wherein a ground conductor is provided between the first electronic component and the second electronic component in the sub-module in a direction parallel to the one of the two main surfaces of the wiring board.

3. The electronic component module according to claim 1, wherein another one of the first electronic component and the second electronic component is in direct contact with a conductor disposed on the substrate.

* * * * *